United States Patent
Coutts et al.

(10) Patent No.: US 11,044,025 B1
(45) Date of Patent: *Jun. 22, 2021

(54) CHARACTERIZING ANTENNA PATTERNS

(71) Applicant: FACEBOOK INC., Menlo Park, CA (US)

(72) Inventors: Gordon Michael Coutts, Santa Clara, CA (US); Damian Kowalewski, Sunnyvale, CA (US)

(73) Assignee: FACEBOOK, INC., Menlo Park, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/721,874

(22) Filed: Dec. 19, 2019

Related U.S. Application Data

(63) Continuation of application No. 15/392,937, filed on Dec. 28, 2016, now Pat. No. 10,547,395.

(51) Int. Cl.
| | |
|---|---|
| *H04B 17/10* | (2015.01) |
| *G01R 29/10* | (2006.01) |
| *H04B 17/00* | (2015.01) |
| *H01Q 1/24* | (2006.01) |
| *H01Q 1/28* | (2006.01) |

(52) U.S. Cl.
CPC .......... *H04B 17/102* (2015.01); *G01R 29/10* (2013.01); *H04B 17/0085* (2013.01); *H01Q 1/246* (2013.01); *H01Q 1/285* (2013.01)

(58) Field of Classification Search
CPC .. G01R 29/10; G01R 29/105; H04B 17/0085; H04B 17/102; H01Q 1/246; H01Q 1/285
See application file for complete search history.

(56) References Cited

U.S. PATENT DOCUMENTS

| | | | |
|---|---|---|---|
| 4,884,078 A | 11/1989 | Fishkin et al. | |
| 5,039,991 A | 8/1991 | Boese et al. | |
| 5,396,255 A | 3/1995 | Durkota et al. | |
| 6,233,437 B1 | 5/2001 | Klenner | |
| 10,547,395 B2 * | 1/2020 | Coutts | ........... G01R 29/10 |
| 2008/0129615 A1 | 6/2008 | Breit et al. | |

(Continued)

FOREIGN PATENT DOCUMENTS

| | | |
|---|---|---|
| CN | 103715512 A | 4/2014 |
| CN | 104730349 A | 6/2015 |
| CN | 105015779 A | 11/2015 |

OTHER PUBLICATIONS

Anonymous: "Report ITU-R SM.2056: Airborne verification of antenna patterns of broadcasting stations", Report ITU-R SM.2056, XP002679803, Jul. 26, 2006, pp. 1-32.

(Continued)

*Primary Examiner* — Dao L Phan
(74) *Attorney, Agent, or Firm* — Artegis Law Group, LLP

(57) ABSTRACT in one embodiment, a method includes determining a received power at a receiving antenna mounted to an antenna measurement system from a transmitting antenna mounted to a device under test (DUI) in motion relative to the antenna measurement system; determining one or more first orientation parameters of the antenna measurement system; determining one or more second orientation parameters of the DUT; and determining an antenna pattern of the transmitting antenna based on the received power, the first orientation parameters, and the second orientation parameters.

20 Claims, 6 Drawing Sheets

(56) References Cited

U.S. PATENT DOCUMENTS

| | | |
|---|---|---|
| 2012/0208567 A1 | 8/2012 | Mesecher |
| 2013/0093622 A1 | 4/2013 | Snow et al. |
| 2016/0088498 A1 | 3/2016 | Sharawi |
| 2018/0183529 A1 | 6/2018 | Coutts et al. |

OTHER PUBLICATIONS

"Measuring Helicopter—Antenna and Coupler Performance", NASA Tech Briefs, NASA, Washington, US, May 1987, p. 423.

* cited by examiner

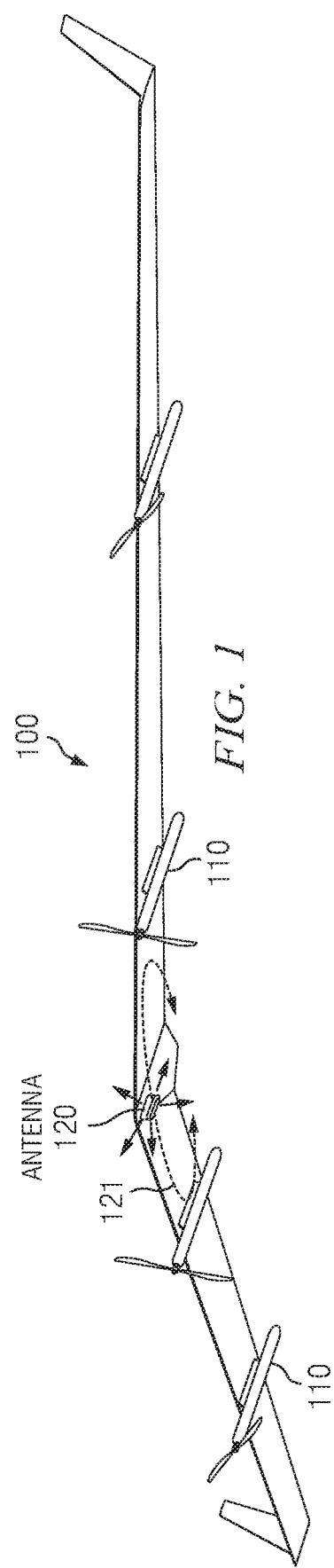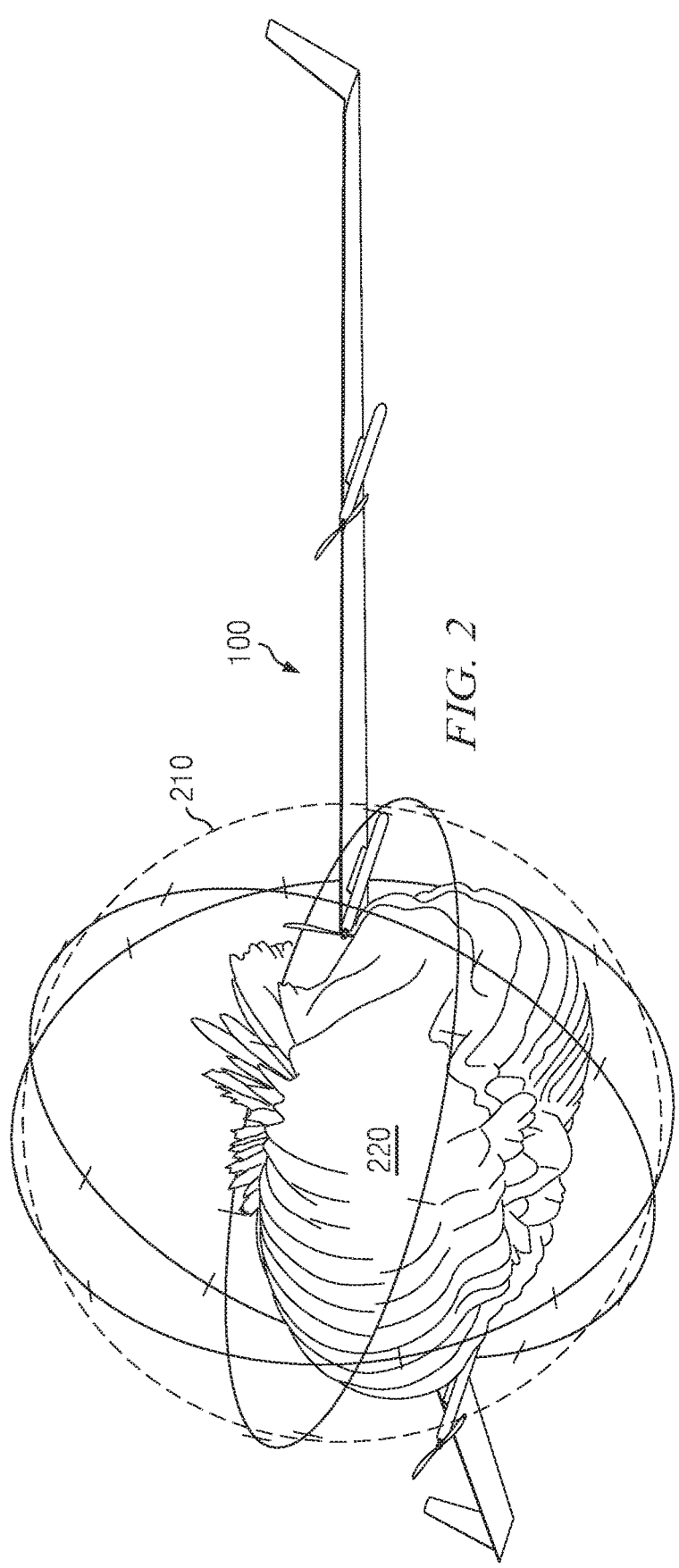

CHARACTERIZING ANTENNA PATTERNS

CROSS-REFERENCE TO RELATED APPLICATIONS

This application claims priority benefit of the United States Provisional Patent Application titled, "CHARACTERIZING ANTENNA PATTERNS," filed on Dec. 28, 2016 and having Ser. No. 15/392,937. The subject matter of this related application is hereby incorporated herein by reference.

TECHNICAL FIELD

This disclosure generally relates to characterizing antenna patterns.

BACKGROUND

Antennas on aircraft are used for wireless communication with other aerial or ground vehicles and stationary structures. To provide communication and connectivity services, antennas emit or radiate antenna signals. The radiated signals may be referred to as an antenna pattern. Aircraft antennas have complex antenna patterns that arise from scattering and diffraction from the aircraft itself and mounted components on the aircraft. An antenna pattern is the relative power density (measured in dB) of the wave transmitted by an antenna in a given direction. Antenna patterns on aircraft are rarely uniform or spherical. Usually they are complex, with different peaks and nulls. Characterizing antenna patterns using an antenna measurement system may be helpful in increasing the size and strength of wireless connections. An antenna measurement system typically consists of transceivers, probes, an inertial measurement unit (IMU), altimeter, and GPS/GLASS.

SUMMARY OF PARTICULAR EMBODIMENTS

In particular embodiments, an antenna measurement system may measure and characterize an unknown antenna pattern produced by an antenna on an aircraft. The antenna and aircraft combination may be referred to as a device under test (DUT). The antenna measurement system may be mounted onto a vehicle, which may be an airborne vehicle (e.g., N-copter) or a ground vehicle (e.g., self-driving car), or a stationary installation (e.g., base station). The antenna measurement system may include one or more antennas mounted at various locations on the vehicle, along with one or more gimbals to steer the antenna and one or more pieces of signal-absorbing foam to absorb extraneous signals. The antennas may be orthogonal probes with phase measurement ability, which may enable the antenna measurement system to characterize linear, circular, and elliptically polarized antenna patterns. The antenna measurement system may further include location and orientation measurement components, including IMU units, GPS, and an altimeter, among other components. The antenna measurement system may travel around the DUT while the DUT produces an unknown antenna pattern. The antenna measurement system may measure and record the signal received from the DUT. Using the location and orientation data obtained from the measurement components, the antenna measurement system may combine the measured DUT data and the location and orientation data to produce an accurate characterization of the antenna pattern produced by the DUT. The above may be accomplished by implementing the following process: determine a received power at a receiving antenna mounted to an antenna measurement system from a transmitting antenna mounted to a device under test (DUT) in motion relative to the antenna measurement system; determine one or more first orientation parameters of the antenna measurement system; determine one or more second orientation parameters of the DUT; and determine an antenna pattern of the transmitting antenna based on the received power, the first orientation parameters, and the second orientation parameters. In particular embodiments, the above process may be implemented with a receiving antenna mounted on the DUT as well as a transmitting antenna mounted on the DUT.

The embodiments disclosed above are only examples, and the scope of this disclosure is not limited to them. Particular embodiments may include all, some, or none of the components, elements, features, functions, operations, or steps of the embodiments disclosed above. Embodiments according to the invention are in particular disclosed in the attached claims directed to a method, a storage medium, a system and a computer program product, wherein any feature mentioned in one claim category, e.g. method, can be claimed in another claim category, e.g. system, as well. The dependencies or references back in the attached claims are chosen for formal reasons only. However any subject matter resulting from a deliberate reference back to any previous claims (in particular multiple dependencies) can be claimed as well, so that any combination of claims and the features thereof are disclosed and can be claimed regardless of the dependencies chosen in the attached claims. The subject-matter which can be claimed comprises not only the combinations of features as set out in the attached claims but also any other combination of features in the claims, wherein each feature mentioned in the claims can be combined with any other feature or combination of other features in the claims. Furthermore, any of the embodiments and features described or depicted herein can be claimed in a separate claim and/or in any combination with any embodiment or feature described or depicted herein or with any of the features of the attached claims.

BRIEF DESCRIPTION OF THE DRAWINGS

FIG. 1 illustrates an example aircraft with an example antenna unit.

FIG. 2 illustrates an example aircraft with example antenna patterns.

DESCRIPTION OF EXAMPLE EMBODIMENTS

Figure 3:
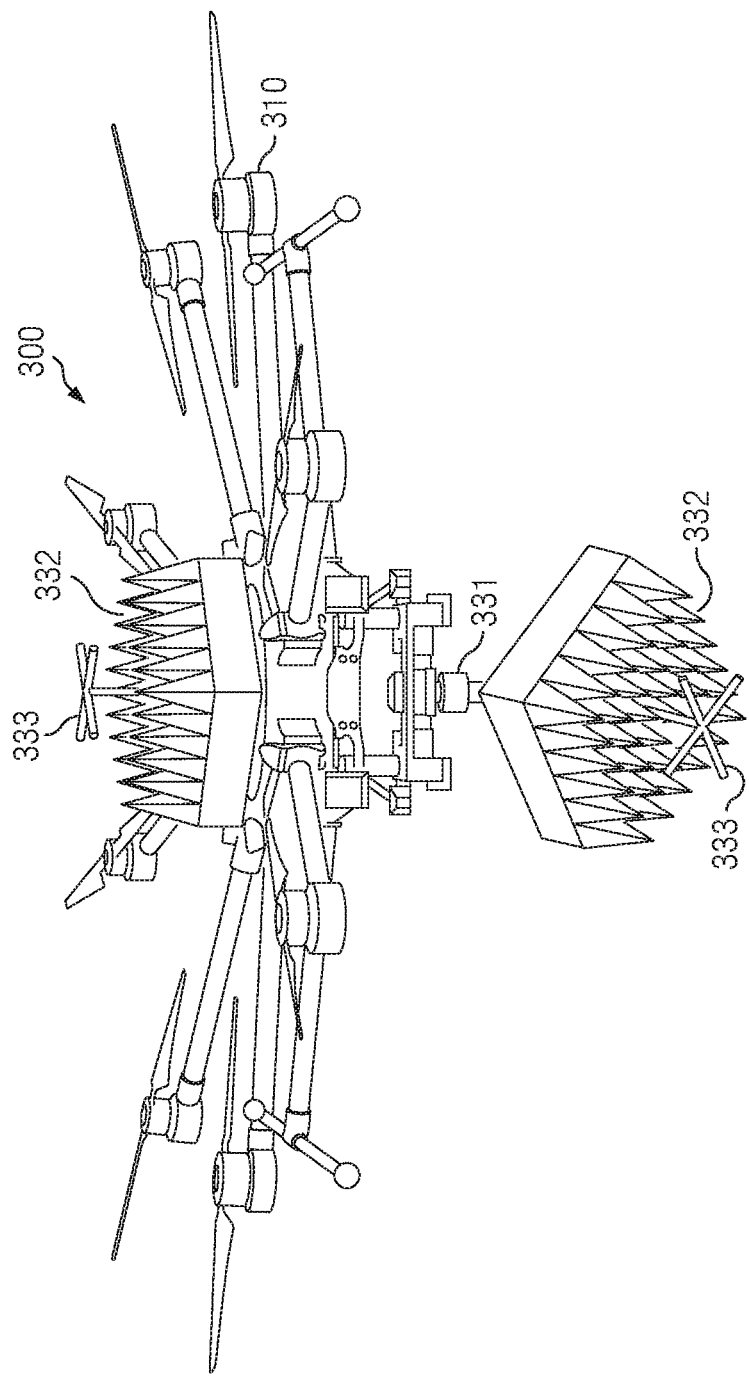
FIG. 3 illustrates an example antenna measurement system.

FIG. 1 illustrates an example aircraft 100 with an example antenna 120. Aircraft 100 may be manned or unmanned and may operate under human control or autonomously. Aircraft 100 may comprise mounted components 110, such as propellers, engines, flaps, ailerons, winglets, a fuselage, tail components, and other suitable components. Aircraft 100 may also comprise an antenna 120. Antenna 120 may emit signals 121 in one or more directions. Some signals 121 may reflect off of or be diffracted by the mounted components on the aircraft. This may affect the antenna signals 121 that are emitted or received from the antenna 121, such signals 121 may not emanate from antenna 120 in straight lines. This may result in antenna 120 producing an antenna pattern 120 that is not spherical, symmetrical, or predictable. The combination of aircraft 100 and antenna 120 may be referred to collectively as a device under test (DUT).

FIG. 2 illustrates an example aircraft 100 and two example antenna patterns 210 and 220. Antenna pattern 210 may represent an idealized antenna pattern, or an antenna pattern generated under idealized conditions. Antenna pattern 210 may be unaffected by mounted components 110 or other atmospheric conditions. Despite every feasible optimization, antenna pattern 210 may not be possible to achieve in the real world. Instead, a real-world antenna pattern may look like antenna pattern 220. Antenna pattern 220 may be an antenna pattern that is affected by aircraft 100 and all its mounted components, including propellers, engines, flaps, ailerons, winglets, a fuselage, tail components, and other suitable components. Antenna pattern 220 may be further affected by atmospheric elements (e.g., air pressure, wind patterns, precipitation, electric fields produced by the earth or storm clouds). Antenna pattern 220 may be an antenna pattern that is typically generated by an antenna on an aircraft. Antenna pattern 220 may be much more complex than the ideal spherical antenna pattern that is represented by antenna pattern 210. Characterizing antenna pattern 220 may be beneficial in increasing the size and strength of wireless connections. As an example and not by way of limitation, knowing the peaks and nulls of antenna pattern 220 may allow an administrator to optimize communications for the particular pattern of antenna pattern 220.

Many techniques exist to measure antenna patterns, including near-field and far-field range measurements, polar planar scanning, bi-polar planar scanning, cylindrical near-field range, and spherical near-field range. Traditional measurement systems, such as aircraft-scale anechoic chambers and outdoor mobile gantry systems are large, costly, and impractical to send to remote locations. An antenna measurement system typically consists of transceivers, probes, an inertial measurement unit (IMU), altimeter, and GPS/GNSS. Mounting these components on an aerial or ground vehicle, or on a stationary location, would enable measurement of aircraft antenna patterns while overcoming the aforementioned limitations.

FIG. 3 illustrates an example antenna measurement system 300 comprising at least some of the components discussed above. Antenna measurement system 300 may comprise vehicle 310, gimbal 331, signal-absorbing foam 332, and one or more antennas 333. Vehicle 310 may be an aerial or ground vehicle, or may be a stationary mount, which may be referred to as a base station. In the particular example given by FIG. 3, antenna measurement system 300 is mounted to an N-copter (e.g., octocopter), but antenna measurement system 300 may alternatively be mounted to a ground vehicle or to a base station that does not move. Gimbal 331 may rotate in all directions such that antenna 333 may be directed in any direction. This may enable full spherical coverage of the area surrounding antenna measurement system 300. Both top and bottom of vehicle 310 may comprise gimbal 331 for steering antenna 333, signal-absorbing foam 332 for preventing signals from reflecting off vehicle 310 and interfering with the accuracy of the measurements, and one or more antennas 333.

In particular embodiments, antenna measurement system 300 may have one or more antennas 333 and need not be limited to two antennas. Antennas 333 may be any suitable antenna, such as orthogonal probe antennas, continuous wave antennas, orthogonal linearly polarized antennas, or orthogonally-fed aperture antennas (e.g., a dual-feed horn). In particular embodiments, antennas 333 of antenna measurement system 300 may be probe antennas which act as transmitters or receivers, or both. In particular embodiments, antenna 120 on aircraft 100 may be a probe antenna which may act as a transmitter or a receiver, or both. A probe antenna may be used to evaluate the extraneous signals that exist in the area surrounding a DUT due to reflections and other transmitting sources. In particular embodiments, antennas 333 may comprise orthogonal probes that may be operable to measure polarized signals. Two orthogonal linearly polarized antennas may enable measurement of linear polarized antenna signals regardless of the orientation of either antennas 333 or aircraft 100. Thus, antennas 333, as orthogonal probe antennas comprising phase measurement ability, may enable antenna measurement system 300 to characterize linear, circular, and elliptically polarized patterns. Probe antennas may be considered to be orthogonal if they produce orthogonal signals. Two signals are orthogonal if their inner product is zero. Mathematically, the inner product of signals g(x) and f(x) may be defined as $<g(x), f(x)> = \int_{-\infty}^{\infty}(g^*(x)f(x))dx$ where $g^*(x)$ is the complex conjugate of g(x). If $<g(x),f(x)>=0$, then g(x) is orthogonal to f(x). In particular embodiments, orthogonal probe antennas may be linearly polarized, circularly polarized, or elliptically polarized, or any combination of the three. This may enable antennas 333 to completely characterize an unknown antenna pattern (e.g., the antenna pattern produced by antenna 120 of aircraft 100). In order to completely characterize the radiation pattern of antenna 120, both the magnitude of the power received from antenna 120 and the phase of the signal produced by antenna 120 are required. These measurements may be specified in two orthogonal directions so that all components of the antenna signal may be captured. As an example and not by way of limitation, antenna 120 may transmit a signal having frequency f. Antenna measurement system 300 may measure an antenna pattern traveling in the y direction at a particular point as $E=\hat{x}Ae^{jD}e^{j2\pi ft}+\hat{z}Be^{jF}e^{j2\pi ft}$, where A is the magnitude of the x component of the antenna pattern, B is the magnitude of the y component of the antenna pattern, D is the phase of the x component of the antenna pattern, and F is the phase of the z component of the antenna pattern. If D=F, the polarization of the antenna pattern is linear. If D and F are separated by 90 degrees, the antenna pattern may be circularly polarized. The antenna patterns produced by antenna 120 may be orthogonal to the direction of travel in the far field region (e.g., far away from antenna 120). Determining the polarization relationship between the antenna pattern emitted of antenna measurement system 300 and the unknown antenna pattern of antenna 120 on aircraft 100 may enable the characterization of linear, circular, and elliptically polarized antenna patterns. This may enable the accurate characterization of the unknown antenna pattern produced by antenna 120. Although this disclosure discusses providing antenna measurement equipment in a particular manner, this disclosure contemplates providing antenna measurement equipment in any suitable manner.

In particular embodiments, vehicle 310, with mounted antenna measurement system 300, may travel around aircraft 100 and sample the received power, or may transmit a predetermined signal to test the transmit and receive performance of antenna 120 on aircraft 100. In particular embodiments, sample points of receive power or transmit power may be determined by the required antenna pattern angular resolution. As one skilled in the art will understand, angular resolution may be the minimum angular separation at which two equal targets can be separated when at the same range. Angular resolution may be limited by the restricted aperture width of the antenna. Determining the angular resolution of both antenna 333 and antenna 120 may enable more accurate measurement of the antenna pattern produced by antenna 120. In particular embodiments, continuous wave may be used for passive antenna measurements as well as measurement of the speed and position of aircraft 100. A continuous wave may be an electromagnetic wave of constant amplitude and frequency. A continuous wave radar may be included as part of antenna measurement system 300, which may be mounted to vehicle 310, which may either be a base station or a moving vehicle. The continuous wave radar may emit a continuous wave directed at aircraft 100 and may receive an echo signal reflected back from aircraft 100. The echo signal may provide information about the speed, shape, direction, and orientation of aircraft 100. Although this disclosure discusses antenna measurement equipment in a particular manner, this disclosure contemplates providing antenna measurement equipment in any suitable manner.

Vehicle 310 may be any suitable type of vehicle, including, but not limited to an N-copter (e.g., octocopter) and ground vehicle (e.g., self-driving car, manned vehicle). In particular embodiments, vehicle 310 may be a stationary mount that is fixed to the ground (e.g., a base station). In particular embodiments, vehicle 310 may be programmed to travel around aircraft 100 at various distances while antenna measurement system 300 measures the antenna pattern produced by antenna 120. In particular embodiments, vehicle 310 may be controlled manually, either by remote control or by a human driver physically present inside vehicle 310. If antenna measurement system 300 is mounted to an N-copter, the N-copter may be programmed to fly around aircraft 100 while aircraft 100 is stationary (e.g., grounded), or while aircraft 100 is in flight. The N-copter may be autonomous or may be remote controlled. The N-copter may also fly around aircraft 100 while aircraft 100 is traveling at various altitudes and speeds in order to fill in the gaps in the antenna pattern measurements of antenna 120 that are not seen from other stationary locations. If antenna measurement system 300 is mounted to a ground structure (e.g., base station), antenna measurement system 300 may measure the antenna signals of antenna 120 as aircraft 100 flies past antenna measurement system 300 while it is fixed to the ground. In particular embodiments, if antenna measurement system 300 is mounted to a ground vehicle, antenna measurement system 300 may measure the antenna signals of antenna 120 as aircraft 100 is stationary (e.g., grounded) and the ground vehicle travels around aircraft 100. In particular embodiments, antenna measurement system 300 may measure the antenna signals of antenna 120 as aircraft 100 is in flight and the ground vehicle is also in motion on the ground. In this scenario, the ground vehicle may be moving in the same direction as aircraft 100, may be moving in the opposite direction of aircraft 100, may be moving perpendicular to the direction of aircraft 100, or may be moving in a zig-zag pattern along the same trajectory as the trajectory of aircraft 100. Although this disclosure discusses providing a vehicle for an antenna measurement system in a particular manner and operating that vehicle in a particular manner, this disclosure contemplates providing and operating a vehicle for an antenna measurement system in any suitable manner.

Vehicle 310, or alternatively, antenna measurement system 300, may include additional features apart from traditional antenna probes and aerial or ground vehicles. Such features may include autopilot, a global positioning system (GPS) receiver or a global navigation satellite system (GNSS) receiver, altimeter, and one or more inertial measurement unit (IMU) systems. These components may be used to determine one or more first orientation parameters of antenna measurement system 300. Examples of orientation parameters include, but are not limited to, the relative position of the antenna measurement system 300 in relation to aircraft 100, path loss from antenna 333 to antenna 120, the orientation of one or more antennas 333, the orientation of antenna 120 or of aircraft 100, or any other suitable parameter related to antenna measurement system 300. An IMU is an electronic device that may measure and reports a body's specific force, angular rate, and, in particular embodiments, the magnetic field surrounding the body, and may use a combination of accelerometers and gyroscopes. An IMU may be installed in antenna measurement system 300, on vehicle 310, or in any other suitable location. The IMU may measure various accelerations and forces on antenna measurement system 300, which may be used to determine an unknown antenna pattern produced by antenna 120. The IMU may detect and record the current rate of acceleration on the antenna measurement system 300 as it is in motion (e.g., in flight or driving on the ground). The IMU may also use internal gyroscopes to detect and record changes in rotational attributes of a body in flight, such as pitch, roll, and yaw. In particular embodiments these components may be referred to as angular and linear accelerometers. Angular accelerometers may measure how the vehicle is rotating in space. There may be one or more sensors for each of three rotational axes: pitch (nose up and down), yaw (nose left and right) and roll (clockwise or counter-clockwise from the "cockpit"). Linear accelerometers may measure non-gravitational acceleration of antenna measurement system 300 in the three rotational axes: pitch, yaw, and roll. The IMU may provide data necessary for characterizing an unknown antenna pattern produced by antenna 120.

In particular embodiment, antenna measurement system 300 may determine one or more second orientation parameters that are associated with the DUT (e.g., aircraft 100). These orientation parameters may include, but are not limited to the relative position of the antenna measurement system 300 in relation to aircraft 100, path loss from antenna 333 to antenna 120, the orientation of one or more antennas 120, the orientation of aircraft 100 (e.g., roll, pitch, yaw), the altitude and velocity of aircraft 100, the shape and makeup of aircraft 120, or any other suitable parameter related to aircraft 100 or antenna 120. The second orientation parameters may be determined using any suitable method, including video surveillance, CW waves as explained previously, or measurement and monitoring components installed on aircraft 100.

Figure 4:
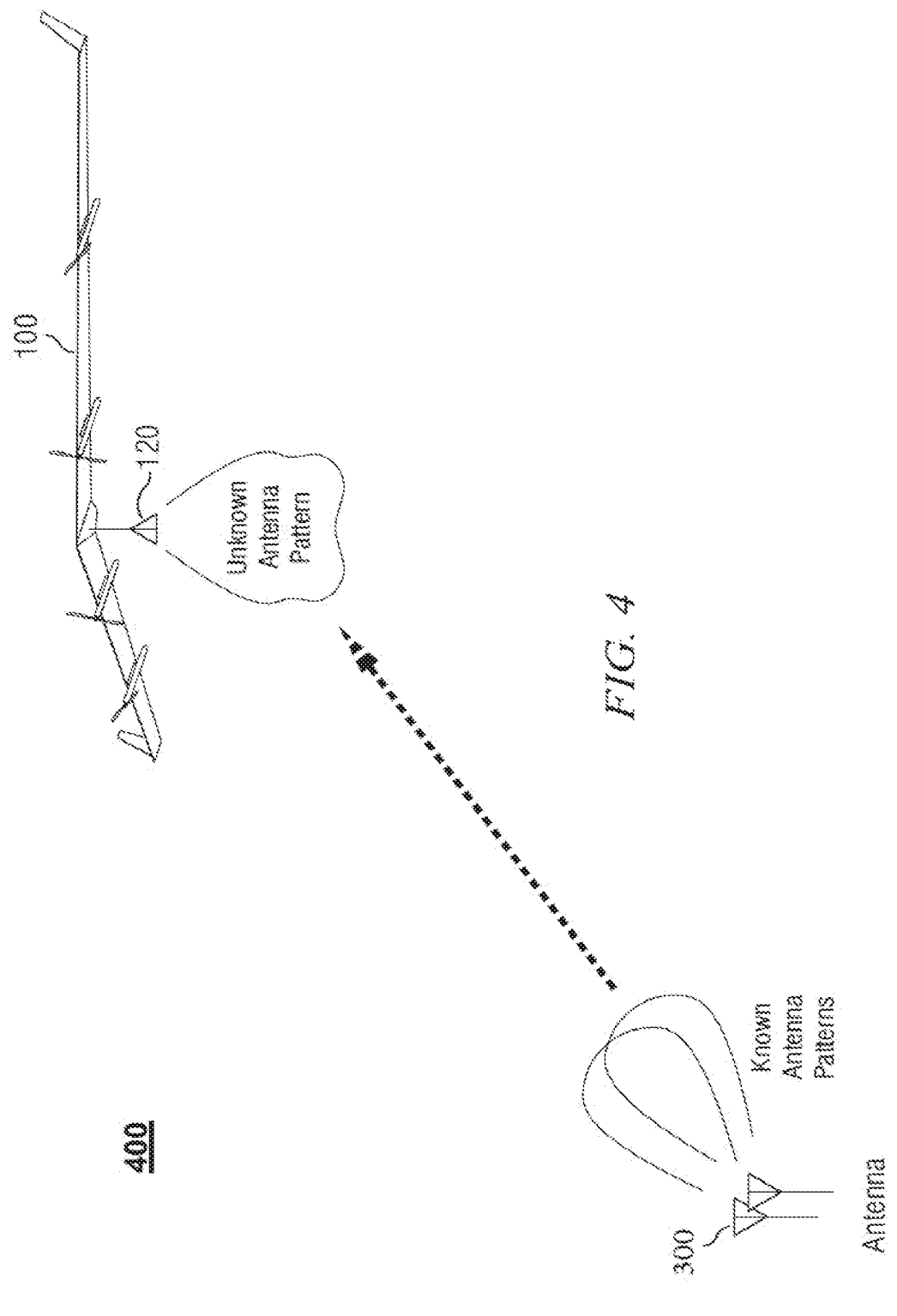
FIG. 4 illustrates antenna measurement system arrangement between an example antenna measurement system and an example aircraft.

FIG. 4 illustrates an example antenna measurement system arrangement 400 between an example antenna measurement system 300 and an example aircraft. In particular embodiments, antenna measurement system 300 may determine a received power at a receiving antenna 333 from a transmitting antenna 120 mounted to a DUT (e.g., aircraft 100) in motion relative to antenna measurement system 300. As will be explained with reference to FIG. 5, in particular embodiments, the DUT in motion relative to the antenna measurement system may comprise: (1) the DUT (e.g., aircraft 100) being stationary and antenna measurement system 300 being in motion; (2) the DUT (e.g., aircraft 100) being in motion and antenna measurement system 300 being stationary; or (3) the DUT (e.g., aircraft 100) being in motion and antenna measurement system 300 being in motion, relative to each other. The term "relative to each other" may mean that the DUT and antenna measurement system 300 may not be travelling in the same direction at the same speed, because in that case they would not be in motion relative to each other. Antenna measurement system 300, mounted to vehicle 310, may be used to measure antenna strength of antenna 120 at various locations around aircraft 100. In particular embodiments, this may be accomplished by flying or driving antenna measurement system 300 around stationary aircraft 100 at different distances and taking measurements of the antenna pattern. In particular embodiments, antenna measurement system 300 may be stationary and aircraft 100 may be in motion. In particular embodiments, both antenna measurement system 300 and aircraft 100 may be in motion. In particular embodiments, measurements may be taken by raster scan, or by any other suitable method for measuring antenna signals. As discussed previously, two orthogonal linearly polarized antennas enable measurement of linear polarization of an antenna pattern produced by antenna 120 regardless of the orientation of antenna 120 or aircraft 100. Measuring the phase of the antenna pattern of antenna 120 may enable antenna measurement system 300 to determine whether the antenna pattern produced by antenna 120 is elliptically or circularly polarized. Measuring the amplitude and phase of orthogonal signals may provide vector data, and from that it may be possible to characterize various aspects of the antenna pattern produced by antenna 120 and the velocity and orientation of aircraft 100 while it is in motion. To accurately characterize an antenna pattern produced by antenna 120, both orientation and position data about aircraft 100 (e.g., second orientation parameters) and orientation and position data about antenna measurement system 300 (e.g., first orientation parameters) must be considered. Both aircraft 100 (and, by extension, antenna 120) and the antenna measurement system may comprise orientation and position data provided by one or more system components (e.g., IMU, altimeter, GPS) that includes roll, pitch, yaw, altitude, latitude, longitude, and velocity, among other things. The antenna pattern produced by antenna measurement system 300 may be known, but the antenna pattern produced by antenna 120 may be unknown. By accounting for various factors, such as path loss of the known antenna pattern produced by antenna measurement system 300, atmospheric effects (e.g., air pressure, wind patterns, precipitation, electric fields produced by the earth or storm clouds), orientation and position data, and the polarization and phase of both the known antenna pattern of antenna measurement system 300 and unknown antenna pattern of antenna 120, it may be possible to accurately characterize the unknown antenna pattern of antenna 120. Although this disclosure discusses measuring an unknown antenna pattern in a particular manner, this disclosure contemplates measuring an unknown antenna pattern in any suitable manner.

In particular embodiments, antenna measurement system 300 may determine the antenna pattern of the transmitting antenna (e.g., antenna 120) based on the received power from the transmitting antenna, the first orientation parameters, and the second orientation parameters. To calculate the unknown antenna pattern produced by antenna 120 using measured data (e.g., known antenna pattern on antenna measurement systems, orientation/location data, path loss, atmospheric effects and other first and second orientation parameters), the Friis transmission formula may first be used. The Friis transmission formula may produce the power received by one antenna under idealized conditions given another antenna some distance away transmitting a known amount of power. Given two antennas, the ratio of power available at the input of the receiving antenna, $P_r$, to output power to the transmitting antenna $P_t$, is given by:

$$\frac{P_r}{P_t} = G_t G_r \left(\frac{\lambda}{4\pi R}\right)^2$$

where $G_t$ and $G_r$ are the antenna gains of the transmitting and receiving antennas, respectively, $\lambda$ is the wavelength, and R is the distance between the antennas. To calculate the power at the receiving antenna in decibels, the equation becomes:

$$P_r = P_t + G_t + G_r + 20\log_{10}\left(\frac{\lambda}{4\pi R}\right).$$

This may be is the general calculation to calculate strength of wireless links. Once this is calculated, the first and second orientation parameters may be accounted for. Thus, when the transmitting and receiving antenna patterns produced by antenna measurement system 300 is known, polarization mismatch is known, antenna gain is known, path loss is known, and receive and transmit power is known, and first and second orientation parameters are known, the unknown variable may be the antenna pattern produced by antenna 120 on aircraft 100. Thus, with orientation data and data produced by atmospheric effects, the Friis equation may be used to accurately characterize the unknown antenna pattern of antenna 120. Although this disclosure discusses measuring an unknown antenna pattern in a particular manner, this disclosure contemplates measuring an unknown antenna pattern in any suitable manner.

Figure 5:
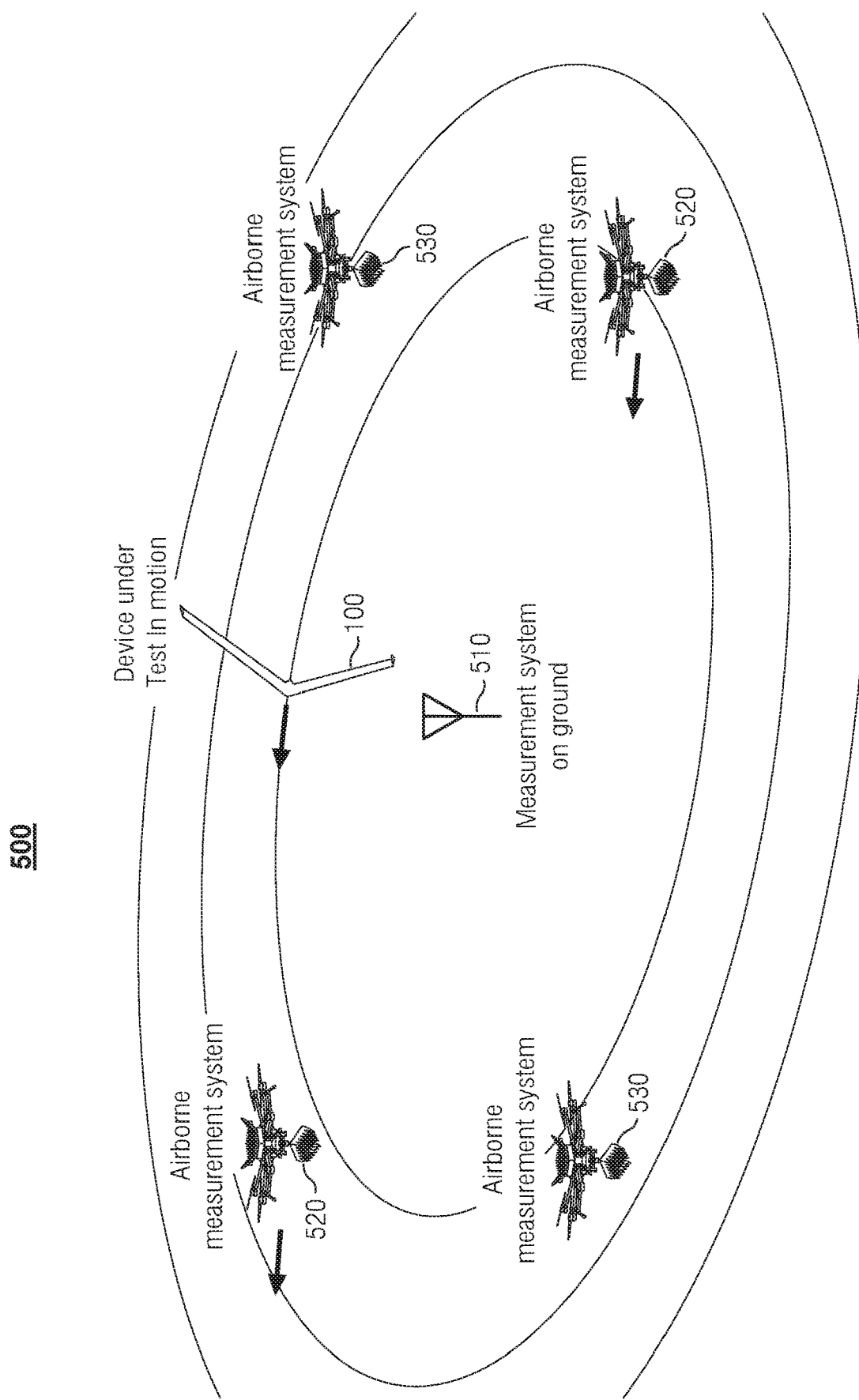
FIG. 5 illustrates an example antenna measurement system arrangement between one or more example antenna measurement systems and an example aircraft.

FIG. 5 illustrates an example antenna measurement system arrangement 500 between one or more antenna measurement systems 300 and aircraft 100. This disclosure contemplates several different arrangements in which at least one of one or more antenna measurement systems 300 and aircraft 100 are in motion. In particular embodiments, a first arrangement may provide an aircraft 100 that may be moving and one or more antenna measurement systems 300 that may be stationary. Aircraft 100 may be flying at low altitude for testing purposes, or may be flying at normal altitudes. Antenna measurement system 300 may be a ground station antenna mounted to a base station 510. Alternatively, the antenna measurement system may be a stationary airborne measurement system 530. As an example and not by way of limitation, one or more antenna measurement systems 300 may be mounted onto one or more N-copters, which may hover at fixed points in the air. As aircraft 100 flies nearby this system of N-copters, antenna measurement systems 300 may measure and record data about the antenna pattern produced by antenna 120 on aircraft 100. In particular embodiments, both a base-station-mounted antenna measurement system 300 and stationary airborne measurement systems 300 may be used at the same time, and both base-station-mounted antenna measurement systems 300 and airborne antenna measurement systems 300 may measure and record data about the antenna pattern produced by antenna 120. The antenna pattern of each antenna measurement system 300 may be known, and the antenna pattern for each transmit beam and receive beam produced by each antenna measurement system 300 may be identical or substantively similar. The antenna pattern of each antenna measurement system 300 may have different gain levels at different geographic locations, altitudes or orientations. The antenna pattern data produced by antenna 120 may be measured and recorded by each antenna measurement system 300. Location and orientation data (e.g., roll pitch, yaw, and altitude) may be accounted for to accurately characterize the antenna pattern produced by antenna 120 on aircraft 100. Although this disclosure discusses measuring an unknown antenna pattern in a particular manner, this disclosure contemplates measuring an unknown antenna pattern in any suitable manner.

In particular embodiments, a second arrangement may provide for an aircraft 100 that is stationary and one or more antenna measurement systems 300 that are in motion. As an example and not by way of limitation, aircraft 100 may either be parked on the ground or suspended in the air by a crane. One or more antenna measurement systems 300 may be mounted to one or more N-copters or ground vehicles. The N-copters or ground vehicles may then travel around aircraft 100 while antenna 120 is producing an antenna pattern. The antenna measurement systems 300 may measure and record the antenna pattern produced by antenna 120. The antenna pattern of each antenna measurement system may be known, and the antenna pattern for each transmit beam and receive beam may be identical. The antenna pattern of each antenna measurement system 300 may be known, and the antenna pattern for each transmit beam and receive beam produced by each antenna measurement system 300 may be identical or substantively similar. The antenna pattern of each antenna measurement system 300 may have different gain levels at different geographic locations, altitudes or orientations. The antenna pattern data produced by antenna 120 may be measured and recorded by each antenna measurement system 300. Location and orientation data (e.g., roll pitch, yaw, and altitude) may be accounted for to accurately characterize the antenna pattern produced by antenna 120 on aircraft 100. Although this disclosure discusses measuring an unknown antenna pattern in a particular manner, this disclosure contemplates measuring an unknown antenna pattern in any suitable manner.

In particular embodiments, a third arrangement may provide for an aircraft 100 and one or more antenna measurement systems 300 that are all in motion. As an example and not by way of limitation, aircraft 100 may be in flight, and one or more antenna measurement systems 300 may be mounted to one or more ground vehicles that are moving in relation to the DUT. (See slide 13—example 3). Alternatively, aircraft 100 may be in flight, and one or more antenna measurement systems may be mounted to one or more aerial vehicles, which are moving in relation to aircraft 100. Alternatively, aircraft 100 may be in flight, and one or more antenna measurement systems may be mounted to one or more aerial vehicles 520 and ground vehicles, which may be moving in relation to aircraft 100. The antenna measurement systems 300 may measure and record the antenna pattern produced by antenna 120. The antenna pattern of each antenna measurement system may be known, and the antenna pattern for each transmit beam and receive beam may be identical. The antenna pattern of each antenna measurement system 300 may be known, and the antenna pattern for each transmit beam and receive beam produced by each antenna measurement system 300 may be identical or substantively similar. The antenna pattern of each antenna measurement system 300 may have different gain levels at different geographic locations, altitudes or orientations. The antenna pattern data produced by antenna 120 may be measured and recorded by each antenna measurement system 300. Location and orientation data (e.g., roll pitch, yaw, and altitude) may be accounted for to accurately characterize the antenna pattern produced by antenna 120 on aircraft 100. Although this disclosure discusses measuring an unknown antenna pattern in a particular manner, this disclosure contemplates measuring an unknown antenna pattern in any suitable manner.

In particular embodiments, a fourth arrangement may provide for an aircraft 100 that is in motion, and one or more antenna measurement systems mounted to vehicles 310, some of which may be in motion and some of which may be stationary. As an example and not by way of limitation, antenna measurement systems 300 may be mounted to one or more base stations 510, one or more ground vehicles, and to one or more airborne measurements systems 520. Any combination of these antenna measurement systems 300 may be stationary in motion. As an example and not by way of limitation, antenna measurement systems 300 mounted to one or more base stations 510 may be stationary, some of airborne measurement systems 520 may be moving, and some of airborne measurement systems 530 may be stationary (e.g., hovering in the air). Aircraft 100 may be moving in relation to all or some antenna measurement systems 300. The antenna measurement systems 300 may measure and record the antenna pattern produced by antenna 120. The antenna pattern of each antenna measurement system may be known, and the antenna pattern for each transmit beam and receive beam may be identical. The antenna pattern of each antenna measurement system 300 may be known, and the antenna pattern for each transmit beam and receive beam produced by each antenna measurement system 300 may be identical or substantively similar. The antenna pattern of each antenna measurement system 300 may have different gain levels at different geographic locations, altitudes or orientations. The antenna pattern data produced by antenna 120 may be measured and recorded by each antenna measurement system 300. Location and orientation data (e.g., roll pitch, yaw, and altitude) may be accounted for to accurately characterize the antenna pattern produced by antenna 120 on aircraft 100. Although this disclosure discusses measuring an unknown antenna pattern in a particular manner, this disclosure contemplates measuring an unknown antenna pattern in any suitable manner.

This disclosure contemplates various applications of antenna measurement system 300, and antenna measurement system arrangements 400 and 500. As an example and not by way of limitation, this disclosure contemplates antenna measurement systems that measure and characterize antenna patterns produced by antennas mounted to land and marine vehicles, the antenna patterns of terrestrial antenna installations (e.g., installations in remote locations), measurement of high gain systems requiring a long antenna range (e.g., the DUT can point upwards to minimize antenna range footprint and interference with other systems during tests), measurement of antenna patterns of large apertures in the field (large apertures need to be measured with a near-field scanner, compact range, or outdoor far-field range), and 3D characterization of communication channels and channel sounding.

Figure 6:
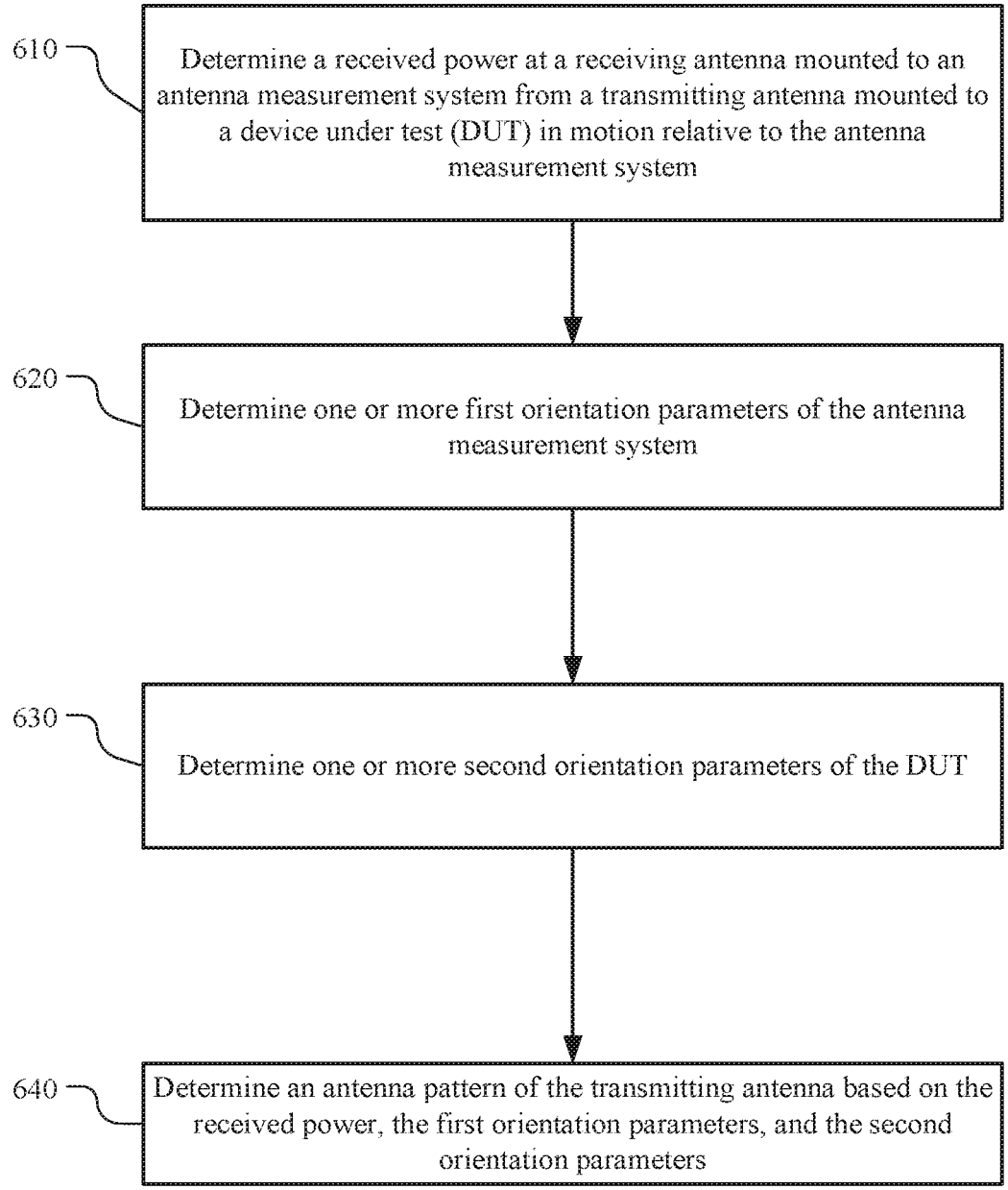
FIG. 6 illustrates an example method for characterizing an antenna pattern.

FIG. 6 illustrates an example method 600 for accurately characterizing an antenna pattern produced by antenna 120 mounted on an aircraft. The method may begin at step 610, where an antenna measurement system may determine a transmitted or received power at a transmitting or receiving antenna mounted to an antenna measurement system from a transmitting or receiving antenna mounted to a device under test (DUT) in motion relative to the antenna measurement system. At step 620, the antenna measurement system may determine one or more first orientation parameters of the antenna measurement system. At step 630, the antenna measurement system may determine one or more second orientation parameters of the DUT. At step 640, the antenna measurement system may determine an antenna pattern of the transmitting antenna based on the received power, the first orientation parameters, and the second orientation parameters. Particular embodiments may repeat one or more steps of the method of FIG. 6, where appropriate. Although this disclosure describes and illustrates particular steps of the method of FIG. 6 as occurring in a particular order, this disclosure contemplates any suitable steps of the method of FIG. 6 occurring in any suitable order. Moreover, although this disclosure describes and illustrates an example method for accurately characterizing an antenna pattern produced by an antenna mounted on an aircraft including the particular steps of the method of FIG. 6, this disclosure contemplates any suitable method for accurately characterizing an antenna pattern produced by an antenna mounted on an aircraft including any suitable steps, which may include all, some, or none of the steps of the method of FIG. 6, where appropriate. Furthermore, although this disclosure describes and illustrates particular components, devices, or systems carrying out particular steps of the method of FIG. 6, this disclosure contemplates any suitable combination of any suitable components, devices, or systems carrying out any suitable steps of the method of FIG. 6.

Figure 7:
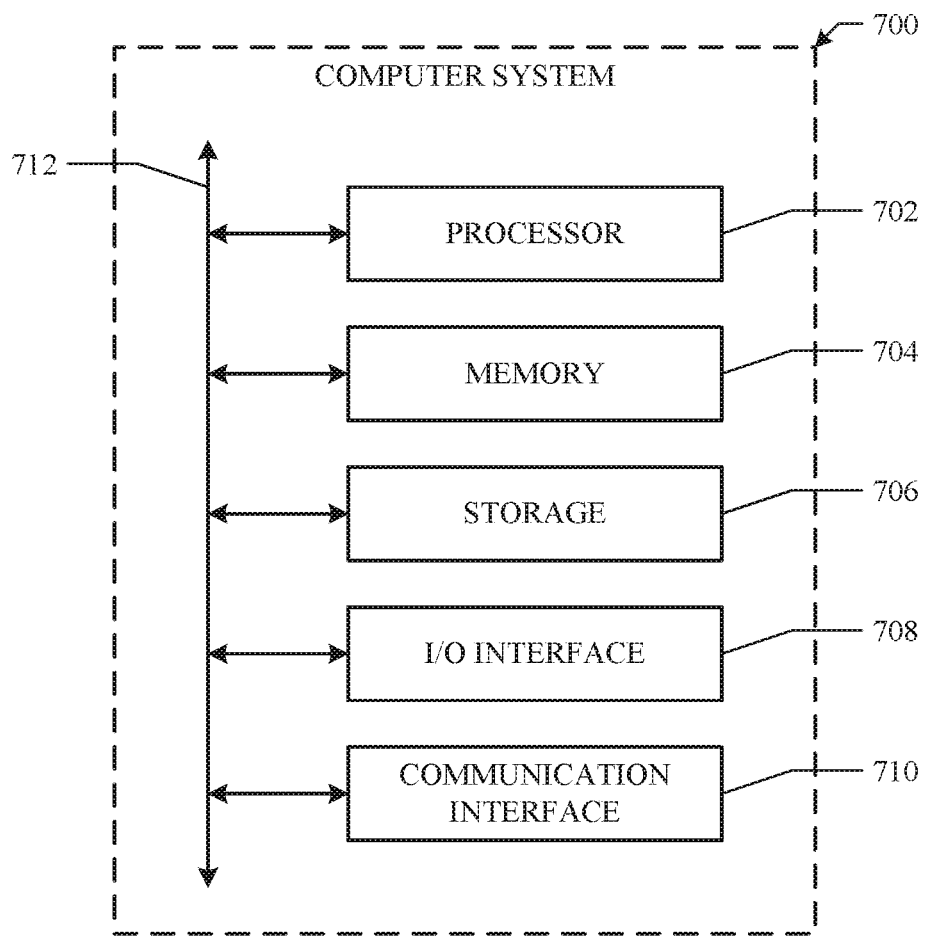
FIG. 7 illustrates an example computer system.

FIG. 7 illustrates an example computer system 700 that may be implemented on antenna measurement system 300. In particular embodiments, one or more computer systems 700 perform one or more steps of one or more methods described or illustrated herein. In particular embodiments, one or more computer systems 700 provide functionality described or illustrated herein. In particular embodiments, software running on one or more computer systems 700 performs one or more steps of one or more methods described or illustrated herein or provides functionality described or illustrated herein. Particular embodiments include one or more portions of one or more computer systems 700. Herein, reference to a computer system may encompass a computing device, and vice versa, where appropriate. Moreover, reference to a computer system may encompass one or more computer systems, where appropriate.

This disclosure contemplates any suitable number of computer systems 700. This disclosure contemplates computer system 700 taking any suitable physical form. As example and not by way of limitation, computer system 700 may be an embedded computer system, a system-on-chip (SOC), a single-board computer system (SBC) (such as, for example, a computer-on-module (COM) or system-on-module (SOM)), a desktop computer system, a laptop or notebook computer system, an interactive kiosk, a mainframe, a mesh of computer systems, a mobile telephone, a personal digital assistant (PDA), a server, a tablet computer system, an augmented/virtual reality device, or a combination of two or more of these. Where appropriate, computer system 700 may include one or more computer systems 700; be unitary or distributed; span multiple locations; span multiple machines; span multiple data centers; or reside in a cloud, which may include one or more cloud components in one or more networks. Where appropriate, one or more computer systems 700 may perform without substantial spatial or temporal limitation one or more steps of one or more methods described or illustrated herein. As an example and not by way of limitation, one or more computer systems 700 may perform in real time or in batch mode one or more steps of one or more methods described or illustrated herein. One or more computer systems 700 may perform at different times or at different locations one or more steps of one or more methods described or illustrated herein, where appropriate.

In particular embodiments, computer system 700 includes a processor 702, memory 704, storage 706, an input/output (I/O) interface 708, a communication interface 710, and a bus 712. Although this disclosure describes and illustrates a particular computer system having a particular number of particular components in a particular arrangement, this disclosure contemplates any suitable computer system having any suitable number of any suitable components in any suitable arrangement.

In particular embodiments, processor 702 includes hardware for executing instructions, such as those making up a computer program. As an example and not by way of limitation, to execute instructions, processor 702 may retrieve (or fetch) the instructions from an internal register, an internal cache, memory 704, or storage 706; decode and execute them; and then write one or more results to an internal register, an internal cache, memory 704, or storage 706. In particular embodiments, processor 702 may include one or more internal caches for data, instructions, or addresses. This disclosure contemplates processor 702 including any suitable number of any suitable internal caches, where appropriate. As an example and not by way of limitation, processor 702 may include one or more instruction caches, one or more data caches, and one or more translation lookaside buffers (TLBs). Instructions in the instruction caches may be copies of instructions in memory 704 or storage 706, and the instruction caches may speed up retrieval of those instructions by processor 702. Data in the data caches may be copies of data in memory 704 or storage 706 for instructions executing at processor 702 to operate on; the results of previous instructions executed at processor 702 for access by subsequent instructions executing at processor 702 or for writing to memory 704 or storage 706; or other suitable data. The data caches may speed up read or write operations by processor 702. The TLBs may speed up virtual-address translation for processor 702. In particular embodiments, processor 702 may include one or more internal registers for data, instructions, or addresses. This disclosure contemplates processor 702 including any suitable number of any suitable internal registers, where appropriate. Where appropriate, processor 702 may include one or more arithmetic logic units (ALUs); be a multi-core processor; or include one or more processors 702. Although this disclosure describes and illustrates a particular processor, this disclosure contemplates any suitable processor.

In particular embodiments, memory 704 includes main memory for storing instructions for processor 702 to execute or data for processor 702 to operate on. As an example and not by way of limitation, computer system 700 may load instructions from storage 706 or another source (such as, for example, another computer system 700) to memory 704. Processor 702 may then load the instructions from memory 704 to an internal register or internal cache. To execute the instructions, processor 702 may retrieve the instructions from the internal register or internal cache and decode them. During or after execution of the instructions, processor 702 may write one or more results (which may be intermediate or final results) to the internal register or internal cache. Processor 702 may then write one or more of those results to memory 704. In particular embodiments, processor 702 executes only instructions in one or more internal registers or internal caches or in memory 704 (as opposed to storage 706 or elsewhere) and operates only on data in one or more internal registers or internal caches or in memory 704 (as opposed to storage 706 or elsewhere). One or more memory buses (which may each include an address bus and a data bus) may couple processor 702 to memory 704. Bus 712 may include one or more memory buses, as described below. In particular embodiments, one or more memory management units (MMUs) reside between processor 702 and memory 704 and facilitate accesses to memory 704 requested by processor 702. In particular embodiments, memory 704 includes random access memory (RAM). This RAM may be volatile memory, where appropriate Where appropriate, this RAM may be dynamic RAM (DRAM) or static RAM (SRAM). Moreover, where appropriate, this RAM may be single-ported or multi-ported RAM. This disclosure contemplates any suitable RAM. Memory 704 may include one or more memories 704, where appropriate. Although this disclosure describes and illustrates particular memory, this disclosure contemplates any suitable memory.

In particular embodiments, storage 706 includes mass storage for data or instructions. As an example and not by way of limitation, storage 706 may include a hard disk drive (HDD), a floppy disk drive, flash memory, an optical disc, a magneto-optical disc, magnetic tape, or a Universal Serial Bus (USB) drive or a combination of two or more of these. Storage 706 may include removable or non-removable (or fixed) media, where appropriate. Storage 706 may be internal or external to computer system 700, where appropriate. In particular embodiments, storage 706 is non-volatile, solid-state memory. In particular embodiments, storage 706 includes read-only memory (ROM). Where appropriate, this ROM may be mask-programmed ROM, programmable ROM (PROM), erasable PROM (EPROM), electrically erasable PROM (EEPROM), electrically alterable ROM (EAROM), or flash memory or a combination of two or more of these. This disclosure contemplates mass storage 706 taking any suitable physical form. Storage 706 may include one or more storage control units facilitating communication between processor 702 and storage 706, where appropriate. Where appropriate, storage 706 may include one or more storages 706. Although this disclosure describes and illustrates particular storage, this disclosure contemplates any suitable storage.

In particular embodiments, I/O interface 708 includes hardware, software, or both, providing one or more interfaces for communication between computer system 700 and one or more I/O devices. Computer system 700 may include one or more of these I/O devices, where appropriate. One or more of these I/O devices may enable communication between a person and computer system 700. As an example and not by way of limitation, an I/O device may include a keyboard, keypad, microphone, monitor, mouse, printer, scanner, speaker, still camera, stylus, tablet, touch screen, trackball, video camera, another suitable I/O device or a combination of two or more of these. An I/O device may include one or more sensors. This disclosure contemplates any suitable I/O devices and any suitable I/O interfaces 708 for them. Where appropriate, I/O interface 708 may include one or more device or software drivers enabling processor 702 to drive one or more of these I/O devices. I/O interface 708 may include one or more I/O interfaces 708, where appropriate. Although this disclosure describes and illustrates a particular I/O interface, this disclosure contemplates any suitable I/O interface.

In particular embodiments, communication interface 710 includes hardware, software, or both providing one or more interfaces for communication (such as, for example, packet-based communication) between computer system 700 and one or more other computer systems 700 or one or more networks. As an example and not by way of limitation, communication interface 710 may include a network interface controller (NIC) or network adapter for communicating with an Ethernet or other wire-based network or a wireless NIC (WNIC) or wireless adapter for communicating with a wireless network, such as a WI-FI network. This disclosure contemplates any suitable network and any suitable communication interface 710 for it. As an example and not by way of limitation, computer system 700 may communicate with an ad hoc network, a personal area network (PAN), a local area network (LAN), a wide area network (WAN), a metropolitan area network (MAN), or one or more portions of the Internet or a combination of two or more of these. One or more portions of one or more of these networks may be wired or wireless. As an example, computer system 700 may communicate with a wireless PAN (WPAN) (such as, for example, a BLUETOOTH WPAN), a WI-FI network, a WI-MAX network, a cellular telephone network (such as, for example, a Global System for Mobile Communications (GSM) network), or other suitable wireless network or a combination of two or more of these. Computer system 700 may include any suitable communication interface 710 for any of these networks, where appropriate. Communication interface 710 may include one or more communication interfaces 710, where appropriate. Although this disclosure describes and illustrates a particular communication interface, this disclosure contemplates any suitable communication interface.

In particular embodiments, bus 712 includes hardware, software, or both coupling components of computer system 700 to each other. As an example and not by way of limitation, bus 712 may include an Accelerated Graphics Port (AGP) or other graphics bus, an Enhanced Industry Standard Architecture (EISA) bus, a front-side bus (FSB), a HYPERTRANSPORT (HT) interconnect, an Industry Standard Architecture (ISA) bus, an INFINIBAND interconnect, a low-pin-count (LPC) bus, a memory bus, a Micro Channel Architecture (MCA) bus, a Peripheral Component Interconnect (PCI) bus, a PCI-Express (PCIe) bus, a serial advanced technology attachment (SATA) bus, a Video Electronics Standards Association local (VLB) bus, or another suitable bus or a combination of two or more of these. Bus 712 may include one or more buses 712, where appropriate. Although this disclosure describes and illustrates a particular bus, this disclosure contemplates any suitable bus or interconnect.

Herein, a computer-readable non-transitory storage medium or media may include one or more semiconductor-based or other integrated circuits (ICs) (such, as for example, field-programmable gate arrays (FPGAs) or application-specific ICs (ASICs)), hard disk drives (HDDs), hybrid hard drives (HHDs), optical discs, optical disc drives (ODDs), magneto-optical discs, magneto-optical drives, floppy diskettes, floppy disk drives (FDDs), magnetic tapes, solid-state drives (SSDs), RAM-drives, SECURE DIGITAL cards or drives, any other suitable computer-readable non-transitory storage media, or any suitable combination of two or more of these, where appropriate. A computer-readable non-transitory storage medium may be volatile, non-volatile, or a combination of volatile and non-volatile, where appropriate.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, feature, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative. Additionally, although this disclosure describes or illustrates particular embodiments as providing particular advantages, particular embodiments may provide none, some, or all of these advantages.

What is claimed is:

1. A method comprising:
   determining a polarized signal at a receiving antenna mounted on an antenna measurement system from a transmitting antenna mounted to a device under test (DUT) in motion relative to the antenna measurement system;
   determining one or more first orientation parameters that identify at least a first orientation of the antenna measurement system;
   determining one or more second orientation parameters that identify at least a second orientation of the DUT; and
   determining, by a computing device, an antenna pattern of the transmitting antenna based on a polarization type of the polarized signal, the one or more first orientation parameters, and the one or more second orientation parameters.

2. The method of claim 1, wherein the DUT in motion relative to the antenna measurement system comprises:
   the DUT being stationary and the antenna measurement system in motion;
   the DUT in motion and the antenna measurement system being stationary; or
   the DUT in motion and the antenna measurement system in motion.

3. The method of claim 1, wherein determining the antenna pattern of the transmitting antenna is further based on one or more atmospheric effects.

4. The method of claim 1, wherein the receiving antenna and the transmitting antenna are orthogonally polarized.

5. The method of claim 1, wherein the antenna measurement system is mounted on an N-copter aerial vehicle, and wherein:
   the N-copter aerial vehicle flies around the DUT while the DUT is stationary; and
   the receiving antenna receives the polarized signal from the transmitting antenna while the N-copter aerial vehicle moving in relation to the DUT.

6. The method of claim 1, wherein the antenna measurement system is mounted on a stationary base station, and wherein:
   the DUT moves in relation to the base station; and
   the receiving antenna receives the polarized signal from the transmitting antenna while the DUT is moving in relation to the base station.

7. The method of claim 1, wherein the antenna measurement system is mounted on an N-copter aerial vehicle, and wherein:
   the N-copter aerial vehicle hovers at a stationary location while the DUT moves in relation to the N-copter aerial vehicle; and
   the receiving antenna receives the polarized signal from the transmitting antenna while the DUT is moving in relation to the base station.

8. The method of claim 1, wherein the antenna measurement system is mounted on an N-copter aerial vehicle, and wherein:
   the N-copter aerial vehicle flies around the DUT while the DUT is in flight; and
   the receiving antenna receives the polarized signal from the transmitting antenna while the N-copter aerial vehicle is moving in relation to the DUT.

9. The method of claim 1, wherein the antenna measurement system is mounted on ground vehicle, and wherein:
   the ground vehicle travels near the DUT while the DUT is in flight; and
   the receiving antenna receives the polarized signal from the transmitting antenna while the ground vehicle is moving in relation to the DUT.

10. The method of claim 1, wherein the first orientation parameters comprise a roll, a pitch, a yaw, an altitude, a latitude, a longitude, or an orientation of the receiving antenna; and the second orientation parameters comprise a roll, a pitch, a yaw, an altitude, a latitude, a longitude, or an orientation of the transmitting antenna.

11. The method of claim 1, wherein determining the polarized signal is accomplished using Friis Transmission Equation.

12. One or more non-transitory computer-readable storage media storing instructions that, when executed by a processor, cause the processor to:
   determine a polarized signal at a receiving antenna mounted on an antenna measurement system from a transmitting antenna mounted to a device under test (DUT) in motion relative to the antenna measurement system;
   determine one or more first orientation parameters that identify at least a first orientation of the antenna measurement system;
   determine one or more second orientation parameters that identify at least a second orientation of the DUT; and
   determine an antenna pattern of the transmitting antenna based on a polarization type of the polarized signal, the one or more first orientation parameters, and the one or more second orientation parameters.

13. The computer-readable storage media of claim 12, wherein the DUT in motion relative to the antenna measurement system comprises:
- the DUT being stationary and the antenna measurement system in motion;
- the DUT in motion and the antenna measurement system being stationary; or
- the DUT in motion and the antenna measurement system in motion.

14. The computer-readable storage media of claim 12, wherein determining the antenna pattern of the transmitting antenna is further based on one or more atmospheric effects.

15. The computer-readable storage media of claim 12, wherein the receiving antenna and the transmitting antenna are orthogonally polarized.

16. The computer-readable storage media of claim 12, wherein the antenna measurement system is mounted on an N-copter aerial vehicle, and wherein:
- the N-copter aerial vehicle flies around the DUT while the DUT is stationary; and
- the receiving antenna receives the polarized signal from the transmitting antenna while the N-copter aerial vehicle moving in relation to the DUT.

17. A system comprising:
one or more processors; and
a memory coupled to the processors comprising instructions executable by the processors, the processors being operable when executing the instructions to:
- determine a polarized signal at a receiving antenna mounted on an antenna measurement system from a transmitting antenna mounted to a device under test (DUT) in motion relative to the antenna measurement system;
- determine one or more first orientation parameters that identify at least a first orientation of the antenna measurement system;
- determine one or more second orientation parameters that identify at least a second orientation of the DUT; and
- determine an antenna pattern of the transmitting antenna based on a polarization type of the polarized signal, the one or more first orientation parameters, and the one or more second orientation parameters.

18. The system of claim 17, wherein determining the antenna pattern of the transmitting antenna is further based on one or more atmospheric effects.

19. The system of claim 17, wherein the receiving antenna and the transmitting antenna are orthogonally polarized.

20. The system of claim 17, wherein the antenna measurement system is mounted on an N-copter aerial vehicle, and wherein:
- the N-copter aerial vehicle flies around the DUT while the DUT is stationary; and
- the receiving antenna receives the polarized signal from the transmitting antenna while the N-copter aerial vehicle moving in relation to the DUT.

* * * * *